United States Patent [19]

Tsutsui

[11] Patent Number: 5,758,020
[45] Date of Patent: May 26, 1998

[54] METHODS AND APPARATUS FOR ENCODING AND DECODING SIGNALS, METHODS FOR TRANSMITTING SIGNALS, AND AN INFORMATION RECORDING MEDIUM

[75] Inventor: Kyoya Tsutsui, Kanagawa, Japan

[73] Assignee: Sony Corporation, Japan

[21] Appl. No.: 424,190

[22] Filed: Apr. 19, 1995

[30] Foreign Application Priority Data

Apr. 22, 1994 [JP] Japan .................... 6-084787

[51] Int. Cl.$^6$ .................................................. C10L 9/00
[52] U.S. Cl. ...................... 395/213; 397/717; 397/738
[58] Field of Search ........................ 395/2.38, 2.12, 395/213, 2.34, 2.67

[56] References Cited

U.S. PATENT DOCUMENTS

| | | | |
|---|---|---|---|
| 4,896,362 | 1/1990 | Veldhuis et al. | 381/30 |
| 5,109,417 | 4/1992 | Fielder et al. | 381/36 |
| 5,115,240 | 5/1992 | Fujiwara et al. | 341/51 |
| 5,142,656 | 8/1992 | Fielder et al. | 381/37 |
| 5,166,686 | 11/1992 | Sugiyama | 341/155 |
| 5,197,087 | 3/1993 | Iwahashi et al. | 375/122 |
| 5,218,561 | 6/1993 | Iwadare | 364/725 |
| 5,222,189 | 6/1993 | Fielder | 395/2 |
| 5,264,846 | 11/1993 | Oikawa | 341/76 |
| 5,285,476 | 2/1994 | Akagiri et al. | 375/25 |
| 5,297,236 | 3/1994 | Antil et al. | 395/2.12 |
| 5,301,205 | 4/1994 | Tsutsui et al. | 375/1 |
| 5,311,549 | 5/1994 | Mahieux | 375/25 |
| 5,311,561 | 5/1994 | Akagiri | 375/122 |
| 5,349,549 | 9/1994 | Tsutsui | 364/725 |
| 5,357,594 | 10/1994 | Fielder | 395/2.2 |
| 5,375,189 | 12/1994 | Tsutsui | 395/2.38 |
| 5,394,473 | 2/1995 | Davidson | 381/36 |
| 5,414,795 | 5/1995 | Tsutsui et al. | 395/2.13 |
| 5,454,011 | 9/1995 | Shimoyoshi | 375/240 |
| 5,461,378 | 10/1995 | Shimoyoshi et al. | 341/51 |
| 5,471,558 | 11/1995 | Tsutsui | 395/2.28 |
| 5,479,562 | 12/1995 | Fielder et al. | 395/2.38 |

FOREIGN PATENT DOCUMENTS

| | | | |
|---|---|---|---|
| 0409248 A2 | 1/1991 | European Pat. Off. | H03M 7/30 |
| WO 91/16769 | 10/1991 | WIPO | H04B 1/66 |

OTHER PUBLICATIONS

S. Chandra et al., "Linear Prediction With a Variable Analysis Frame Size," IEEE Transactions on Acoustics, Speech & Signal Processing, vol. ASSP-25, No. 4, Aug. 1977, pp. 322-330.

J. Rothweiler, "Polyphase Quadrature Filters—New Subband Coding Technique," IEEE Int'l Conference on Acoustics, Speech & Signal Processing, vol. 3 of 3, Apr. 14-16, 1983, pp. 1280-1283.

R. Crochiere et al., "Digital Coding of Speech in Sub-Bands," The Bell System Technical Journal, vol. 55, No. 8, Oct. 1069-1085.

J. Princen et al., "Subband/Transform Coding Using Filter Bank Designs Based on Time Domain Aliasing Cancellation," IEEE Apr. 6-9, 1987, pp. 2161-2164.

M. Krasner, "The Critical Band Coder—Digital Encoding of Speed Signals Based on the Perceptual Requirements of the Auditory System," IEEE Apr. 1980, pp. 327-331.

R. Zelinski et al., "Adaptive Transform Coding of Speech Signals," IEEE Transactions of Acoustics, Speech & Signal Processing, vol. ASSP-25, No. 4, Aug.1977, pp. 299-309.

Primary Examiner—Allen R. MacDonald
Assistant Examiner—Susan Wieland
Attorney, Agent, or Firm—Limbach & Limbach L.L.P.

[57] ABSTRACT

A method for encoding the information has a forward inverse transform step of forward orthogonal transforming an input signal using a pre-set windowing function to form an output spectral signal, and an encoding step of encoding the resulting output spectral signal from the forward orthogonal transform. The preset windowing function having a smaller slope of a characteristic curve at both skirt ends is employed. This allows efficient encoding when employing a transform constituting a waveform signal by overlapping waveform elements with both neighboring waveform elements for generating a waveform signal during inverse orthogonal transform, such as MDCT.

48 Claims, 16 Drawing Sheets

TRANSFORM WINDOWING FUNCTION

WAVEFORM SIGNAL SW

QUANTIZATION NOISE QN 5,758,020

METHODS AND APPARATUS FOR ENCODING AND DECODING SIGNALS, METHODS FOR TRANSMITTING SIGNALS, AND AN INFORMATION RECORDING MEDIUM

BACKGROUND OF THE INVENTION

This invention relates to a method and apparatus for encoding the information, such as input digital data, by high-efficiency encoding, an information medium for recording the encoded information, a method for transmitting the encoded information and a method and apparatus for reproducing and decoding the encoded and transmitted or recorded information for producing the original information.

Among a variety of techniques for digitally encoding audio or speech signals, there is the transform coding in which an audio signals on the time axis are divided into plural time blocks and each time block of digital signals representing the audio signals on the time axis is converted by an orthogonal transform into signals on the frequency axis. There is also the sub-band coding (SBC) in which a filter divides the frequency band of the audio signal into a plurality of sub-bands prior to encoding. In the sub-band coding, the signal is not formed into frames along the time axis prior to encoding. There is also the combination of sub-band coding and transform coding, in which digital signals representing the audio signal are divided into a plurality of frequency ranges by sub-band coding and transform coding is applied to each of the frequency ranges.

Among known filters for dividing a frequency spectrum into a plurality of frequency ranges, there is the quadrature mirror filter (QMF) as discussed in, for example, R.E. Crochiere, Digital Coding of Speech in Sub-bands, 55 Bell Syst. Tech. J., No.8 (1976). The QMF filter divides a frequency spectrum into equal-width frequency ranges. With the QMF filter, aliasing is not produced when synthesizing the divided frequency ranges.

In J.H. Rothweiler, Polyphase Quadrature Filters- A New Coding Technique, ICASSP 83, BOSTON, there is disclosed a technique of dividing the frequency spectrum into plural frequency ranges by a polyphase quadrature filter. With the polyphase quadrature filter, the frequency spectrum of a signal can be divided at a time into equal-width frequency ranges.

Among the techniques for orthogonal transform, there is the technique of dividing the digital input audio signal into frames of a predetermined time duration, and processing the resulting frames using discrete Fourier transform (DFT), discrete cosine transform or modified DCT (MDCT). Discussion of a MDCT may be found in J.P. Princen and A.B. Bradley, University of Surrey Royal Melbourn Inst. of Tech., Sub-band/Transform Coding Using Filter Bank Aliasing Based on Time Domain Aliasing Cancellation, ICASSP 1987.

By quantizing signals divided in frequency by the filter or an orthogonal transform, such as frequency components resulting from orthogonal transform, the frequency band subject to quantization noise may be controlled, and the encoding psycho-acoustically more efficient may be achieved by taking advantage of the so-called masking effect. If signal components of each band are normalized within the absolute maximum value of the signal component in the bands, more efficient encoding may be achieved. The present Assignee has disclosed in JP Patent Kokai JP-A-5-183442 a high efficiency encoding method employing an MDCT.

In a technique of quantizing the spectral coefficients resulting from an orthogonal transform, it is known to use sub-bands that take advantage of the psychoacoustic characteristics of the human auditory system. In this, spectral coefficients representing an audio signal on the frequency axis may be divided into a plurality of critical frequency bands. The widths of the critical bands increase with increasing frequency. Normally, about 25 critical bands are used to cover the audio frequency spectrum of 0 Hz to 20 kHz. In such a quantizing system, bits are adaptively allocated among the various critical bands. For example, when applying adaptive bit allocation to the spectral coefficient data resulting from a MDCT, the spectral coefficient data within each of the critical bands is quantized using an adaptively allocated number of bits. For encoding MDCT coefficient data, for example, resulting from MDCT processing, the band-based MDCT coefficient data resulting from block-based MDCT processing is quantized with an adaptively allocated number of bits. The following two are among known bit allocation techniques.

In Z. Zelinski and P. Noll, IEEE Trans. on Acoustics, Speech and Signal Processing, Vol. ASSP-25, No.4 (1977, Aug.), bit allocation is carried out on the basis of the amplitude of the signal in each band. This technique produces a flat quantization noise spectrum and minimizes noise energy, but the noise level perceived by the listener is not optimum because the technique does not exploit the psychoacoustic masking effect.

In the bit allocation technique described in M.A. Krassner, The Critical Band Encoder- Digital Encoding of the perceptual Requirements of the Auditory System, ICASSP 1980, the psychoacoustic masking mechanism is used to determine a fixed bit allocation that produces the necessary signal-to-noise ratio for each critical band. However, if the signal-to-noise ratio of such a system is measured using a strongly tonal signal, for example, a 1-kHz sine wave, non-optimum results are obtained because of the fixed allocation of bit among the critical bands.

For resolving the above inconveniences, a high efficiency encoding device has been proposed in which the total bits available for bit allocation is divided into a fixed bit allocation portion having a fixed number of bits for each subblock and a bit allocation portion having a number of bits variable in dependence upon the signal magnitude of each block, and in which the ratio of division is dependent on a signal pertinent to the input signal such that the division ratio of the fixed bit allocation portion becomes higher the smoother the signal spectrum.

With such device, the overall signal-to-noise ratio may be significantly improved by allocating a larger number of bits to a block containing spectral components (frequency components) about which the signal energy is concentrated, as occurs for a sine wave input. Since the human hearing sense is sensitive to a signal having spectral components with steep slope, such method leading to an improved signal-to-noise ratio improves not only improves measured values but also the sound quality as perceived by the listener.

There are a number of methods for bit allocation other than those described above. In addition, the model simulating the human hearing sense has been refined, such that psycho-acoustically more efficient encoding is feasible with improvement in the capacity of the encoding device predicted in future.

When the above-mentioned DFT or DCT is employed as a method for converting waveform signals on the time axis, such as audio signals, into spectral components, an M-number of independent real-number data are obtained if transform is carried out using time blocks each consisting of an M-number of samples. Since an M1 number of samples are overlapped with both neighboring time blocks for diminishing connection distortion among time blocks, an M-number of real-number data on an average are quantized and encoded with DFT or DCT for a (M-M1)-number of samples.

On the other hand, if MDCT is employed as a method for orthogonal transform, since an M-number of independent real-number data are obtained from a 2M number of samples overlapped with both neighboring time blocks by an M-number of both side time blocks, an M-number of real-number data are quantized and encoded in MDCT for an M-number of samples. In a decoding device, waveform elements obtained by carrying out inverse transform in each block from the codes resulting from MDCT with signal overlapping of neighboring waveform elements for reconstituting the waveform signals.

In general, the frequency resolution is improved by elongating the time block length for orthogonal transform, such that the signal energy is concentrated in specified spectral components. Thus, if transform is carried out by MDCT using a long time block length with one-half overlap with both side neighboring time blocks, with the number of the resulting spectral components being not increased with respect to the number of original samples, more efficient encoding may be achieved than if DFT or DCT is employed. In addition, by providing a sufficiently long overlap with the both side neighboring blocks, the inter-block distortion of the waveform signals resulting from inverse orthogonal transform may be diminished.

However, if transform is performed by MDCT in which waveform elements are overlapped with those of both side neighboring time blocks during inverse transform for constituting the waveform signals, certain requirements need be satisfied by a window employed for orthogonal transform and inverse orthogonal transform. If such requirements are not satisfied, time-domain signals cannot be correctly restored by inverse transform of the spectral components resulting from the orthogonal transform. Since a windowing function having a sufficiently smooth shape was not used as the windowing function for forward orthogonal transform satisfying the above condition, the energy distribution of the spectral components obtained on orthogonal transform becomes poor in concentration, as a result of which a large number of spectral components need to be encoded with sufficiently fine steps to render it difficult to achieve efficient encoding.

OBJECT AND SUMMARY OF THE INVENTION

It is therefore an object of the present invention to provide a method and apparatus for encoding the information in which efficient encoding is assured with a transform, such as MDCT, in which waveform elements of a given time block are overlapped with waveform elements of both side neighboring time blocks.

It is another object of the present invention to provide a method and apparatus for decoding the waveform signals encoded by the above-described encoding method and apparatus.

It is a further object of the present invention to provide an information recording medium having recorded thereon the information encoded by the above-mentioned encoding method and apparatus, and a method for transmitting the encoded information.

According to the present invention, when employing a transform involving an inverse transform in which waveform elements of a given time block are overlapped with both side neighboring time blocks for constituting a waveform signal, such as MDCT, a windowing function having a smooth shape is applied as a windowing function for forward orthogonal transform for assuring efficient encoding.

In one aspect, the present invention provides a method for encoding an input signal having a forward inverse transform step of forward orthogonal transforming the input signal using a preset windowing function to form an output spectral signal, and a step of encoding the resulting output spectral signal from the forward orthogonal transform, and a corresponding apparatus for encoding an input signal. As a windowing function, a pre-set windowing function having a smaller slope of a characteristic curve at both skirt portions thereof is employed.

The curve representing the characteristics of the windowing function has a slope which is changed from a small value to a larger value and then from the larger value to a smaller value in a direction away from one of its skirt portions. More specifically, the pre-set windowing function may be represented by the equation (12) in which w(n) is the windowing function, p is a value in the vicinity of 2 and M is the number of output spectral components. The forward orthogonal transform is such a transform in which waveform elements of a given time block are overlapped with waveform elements of neighboring time blocks during inverse transform, and thus may be a modified discrete cosine transform. The pre-set windowing function may include or may not include a domain having a value of 0. The pre-set windowing function may be symmetrical or asymmetrical in shape. The input signal may be an audio signal.

In another aspect, the present invention provides an information decoding method having a step of decoding an encoded signal encoded by pre-set information encoding for outputting a spectral signal, and a step of inverse orthogonal transforming output spectral signal components from the decoding using a preset windowing function. As the pre-set windowing function, a windowing function having a smaller slope of a characteristic curve at both skirt portions thereof may be employed. The present invention also provides a corresponding decoding apparatus.

The curve representing the characteristics of the windowing function has a slope which is changed from a small value to a larger value and then from the larger value to a smaller value in a direction away from one of the skirt portions. More specifically, the pre-set windowing function may be represented by the equation (12). The forward orthogonal transform is such a transform in which waveform elements of a given time block are overlapped with waveform elements of neighboring time blocks during inverse transform, and thus may be modified discrete cosine transform. The pre-set windowing function may include or may not include a domain having a value of 0. The pre-set windowing function may be symmetrical or asymmetrical in shape. The input signal may be an audio signal.

In still another aspect, the present invention provides an information recording medium having recorded thereon the information produced by forward orthogonal transforming an input signal using a pre-set windowing function represented by a curve having small slope at both skirt portions thereof to form an output spectral signal and by encoding the output spectral signal, and a method for transmitting the information comprising forward orthogonal transforming an input signal using a pre-set windowing function having characteristics represented by small slope at both skirt portions thereof to produce an output spectral signal and transmitting the resulting output spectral signal.

With the information recording medium and the information transmitting method according to the present invention, the curve representing the characteristics of the windowing function has a slope which is changed from a small value to a larger value and then from the larger value to a smaller value in a direction away from one of the ends. The pre-set windowing function may be represented by the equation (12). The forward orthogonal transform is such a transform in which a waveform element of a given time block is overlapped with waveform elements of neighboring time blocks during inverse transform, and thus may be modified discrete cosine transform. The pre-set windowing function may include or may not include a domain having a value of 0, and may be symmetrical or asymmetrical in shape. The input signal recorded or transmitted may be an audio signal.

According to the present invention, the windowing function becomes smoother at both skirt portions by employing a windowing function having a characteristic curve having small slope at both skirt portions during forward orthogonal transform, so that a narrower distribution of the spectral components resulting from transform may be achieved. By employing the same windowing function for inverse orthogonal transform, the original signal may be reproduced correctly.

Also, according to the present invention, efficient encoding may be achieved by employing a windowing function represented by a pre-set equation and by setting the value of p so as to be 2 or in its vicinity.

In addition, according to the present invention, the energy distribution of the spectral components may be improved in concentration even in cases wherein the windowing function needs to satisfy a pre-set constraint, thus assuring efficient encoding.

BRIEF DESCRIPTION OF THE INVENTION

Figure 5A:
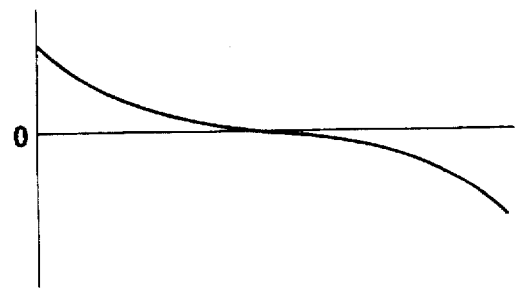
Figure 5A:
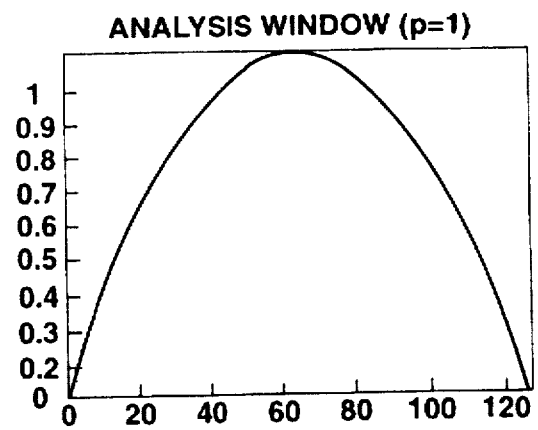
Figure 5B:
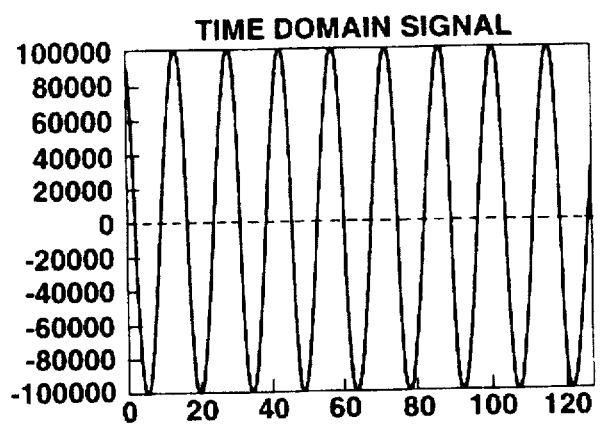
Figure 5C:
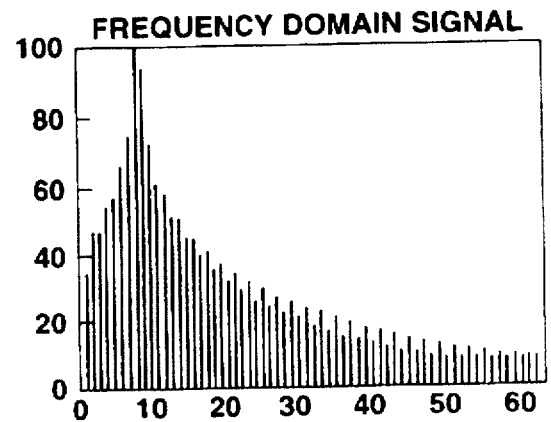

FIGS. 5a, 5A, 5B, and 5C are graphs showing an example of a conventional spectral distribution in case of employing a windowing function of the equation (11) corresponding to the equation (12) where p is set to 1.

Figure 6A:
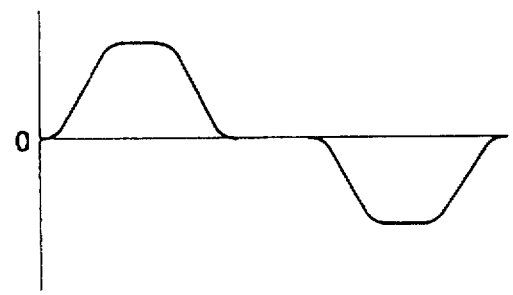
Figure 6A:
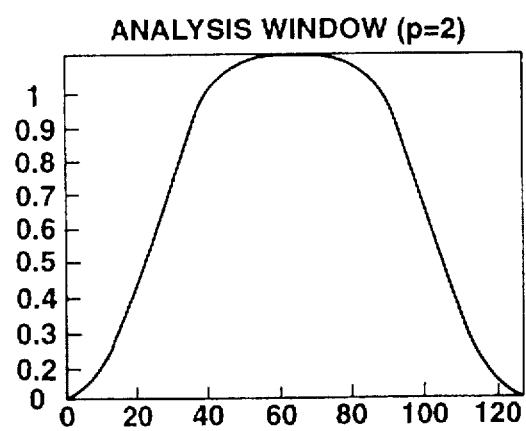
Figure 6B:
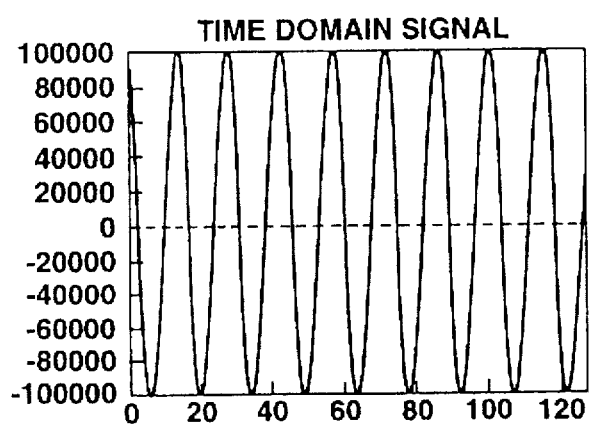
Figure 6C:
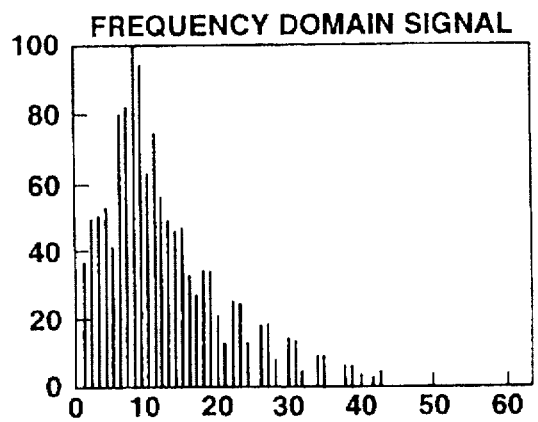

FIGS. 6a, 6A, 6B and 6C are graphs showing an example of spectral distribution in case of employing a windowing function of the equation (12) where p is set to 2.

Figure 7A:
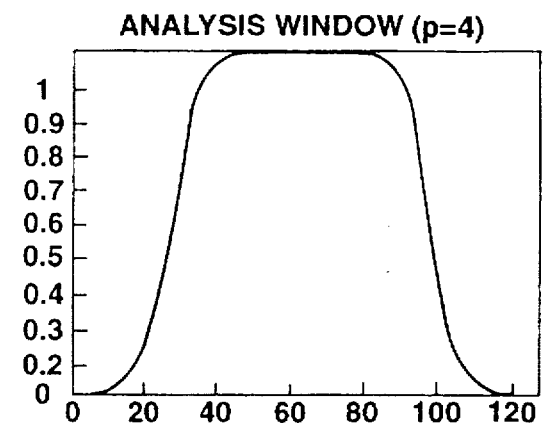
Figure 7B:
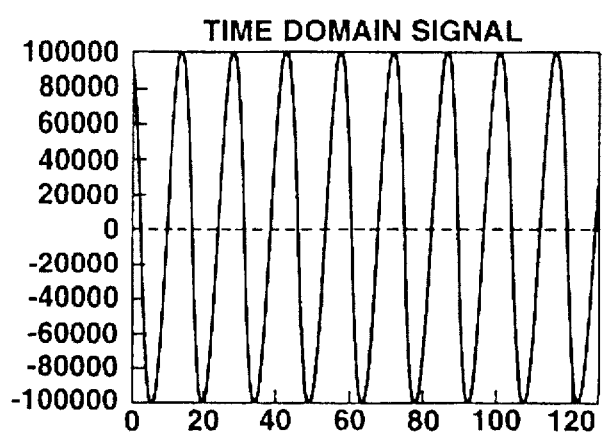
Figure 7C:
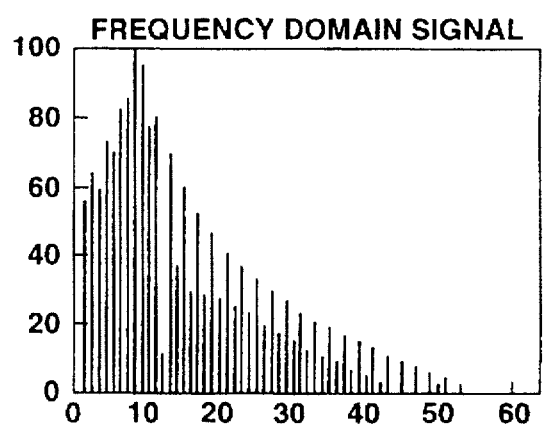

FIGS. 7A, 7B and 7C are graphs showing an example of spectral distribution in case of employing a windowing function of the equation (12) where p is set to 4.

Figure 8A:
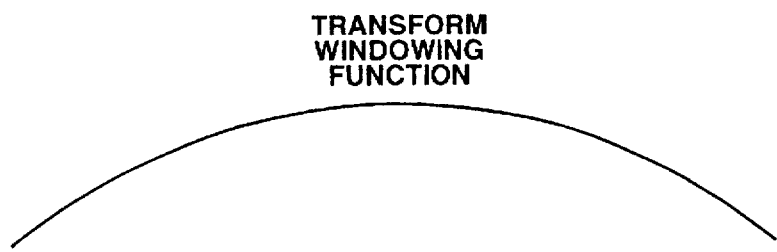
Figure 8B:
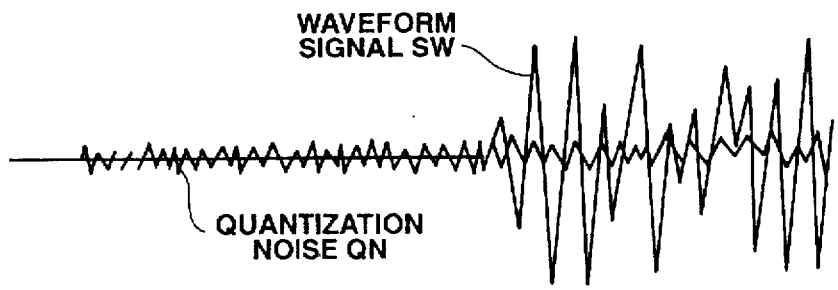

FIGS. 8A and 8B show the windowing function of the equation (11) and the spectral signals.

Figure 9:
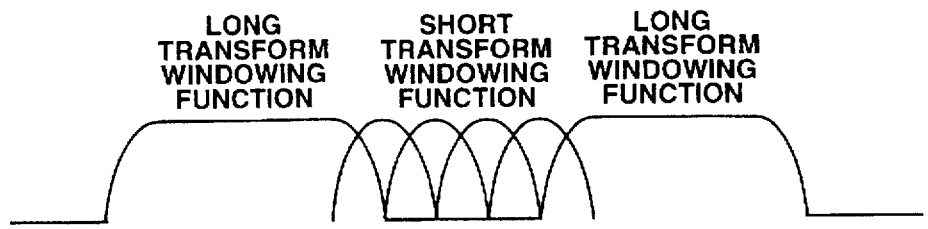

FIG. 9 illustrates an example of a windowing function of a conventional technique devised for diminishing the obstruction to the human auditory sense cause by pre-echo.

Figure 10:
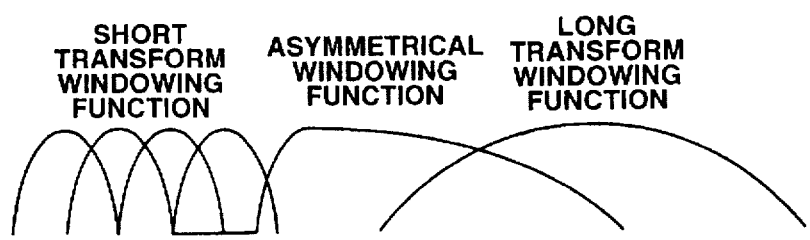

FIG. 10 illustrates a windowing function asymmetrical between a short-term transform portion and a long-term transform portion.

Figure 11:
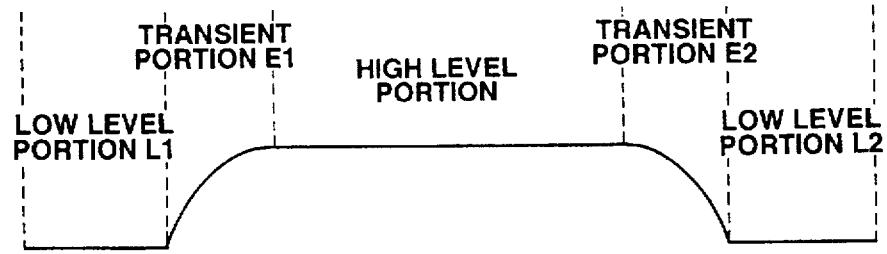

Fig. 11 illustrates the shape of a forward transform windowing function of MDCT.

Figure 12A:
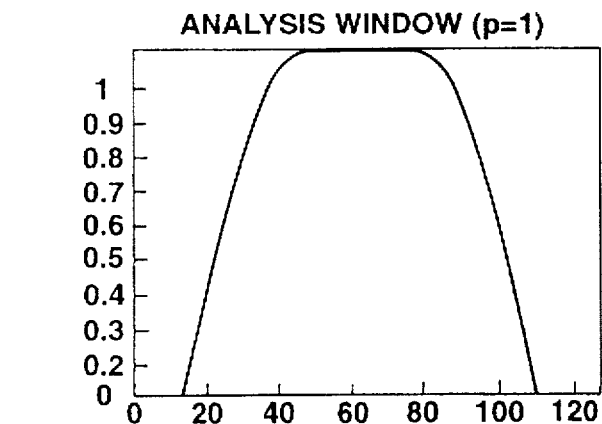
Figure 12B:
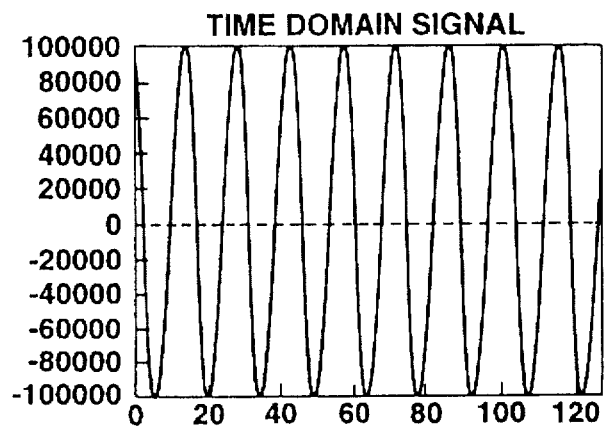
Figure 12C:
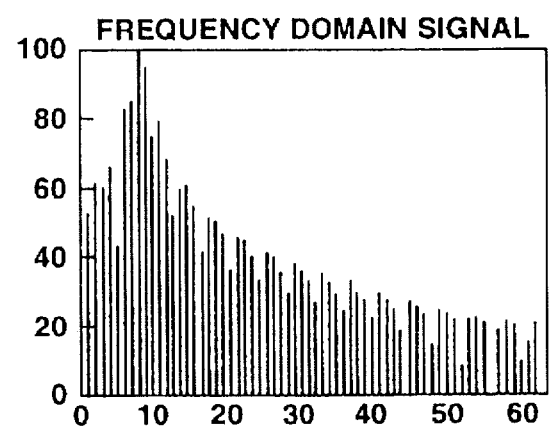

FIGS. 12A, 12B and 12C illustrate spectral distribution in case of application of a conventional transform window shape in a transient portion in a long-term transform window designed to be smoothly connected to a short-term transform windowing function.

Figure 13A:
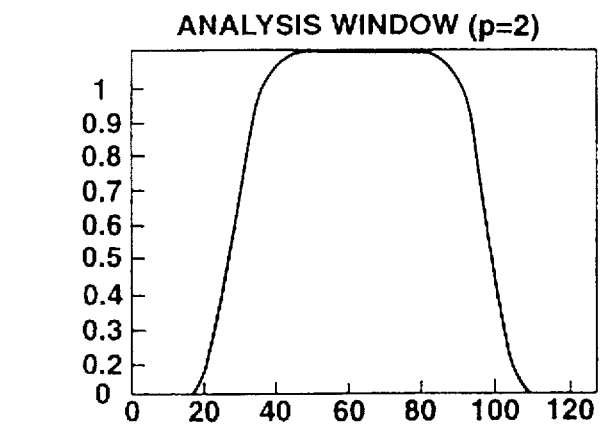
Figure 13B:
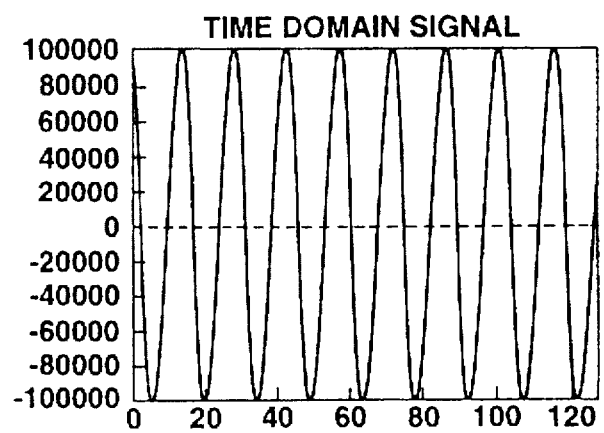
Figure 13C:
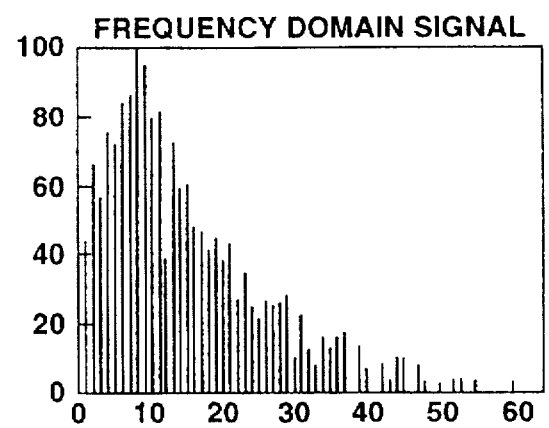

FIGS. 13A, 13B and 13C illustrate spectral distribution in case of application of a transform window shape according to the present invention in a transient portion in a long-term transform window designed to be smoothly connected to a short-term transform windowing function.

Figure 14A:
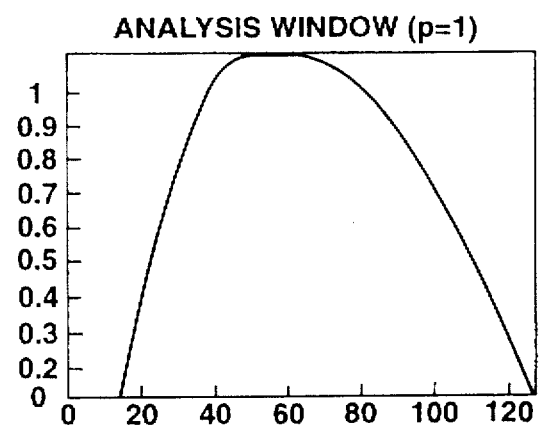
Figure 14B:
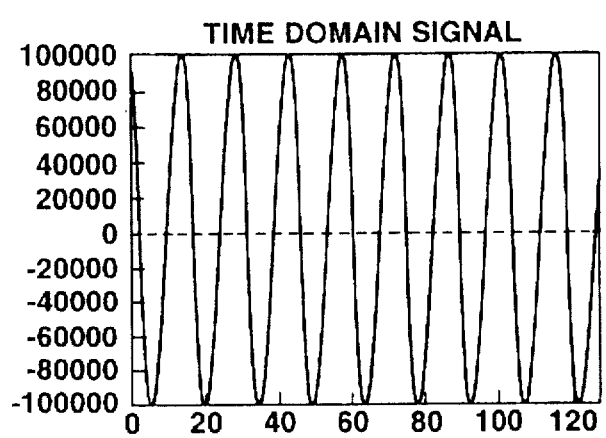
Figure 14C:
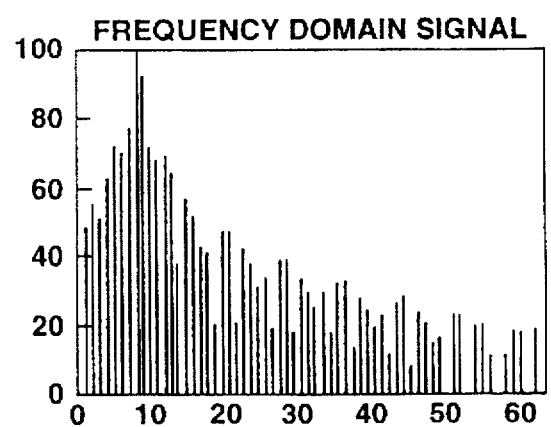

FIGS. 14A, 14B and 14C illustrate spectral distribution in case of application of a conventional transform window shape in a transient portion in an asymmetrical windowing function.

Figure 15A:
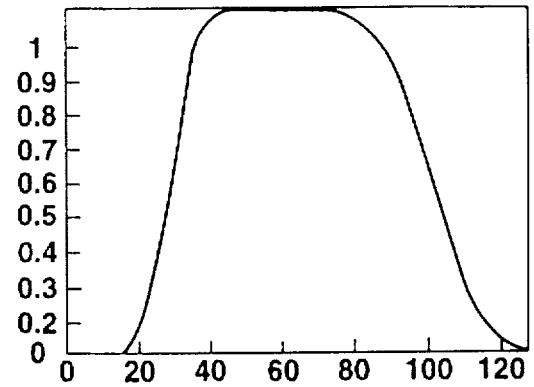
Figure 15B:
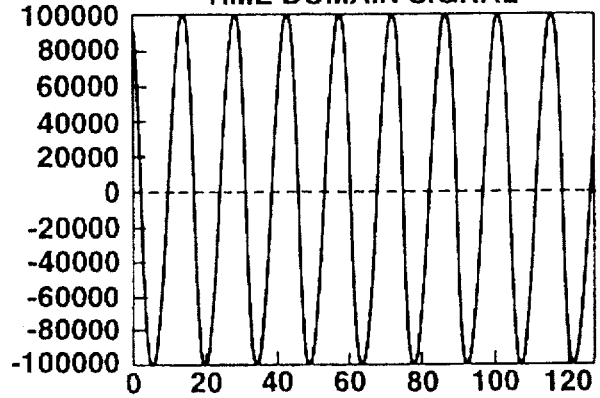
Figure 15C:
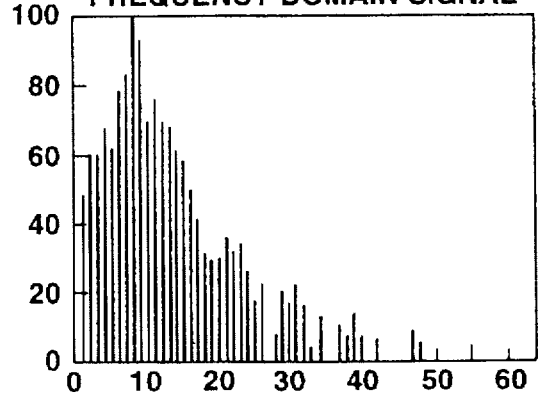

FIGS. 15A, 15B and 15C illustrate spectral distribution in case of application of a transform window shape according to the present invention in a transient portion in an asymmetrical windowing function.

Figure 16:
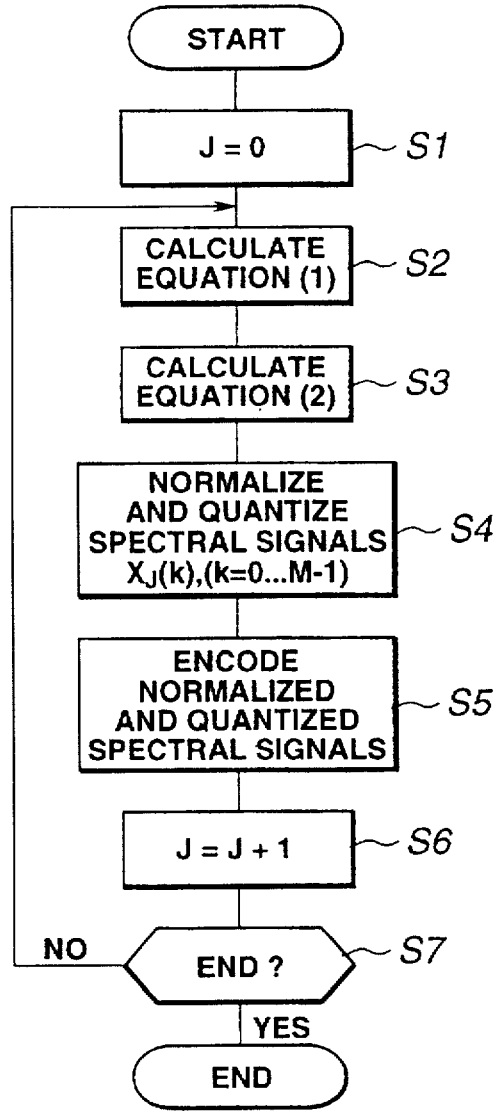

FIG. 16 is a flow chart for illustrating a processing flow of the information encoding method of the present invention.

Figure 17:
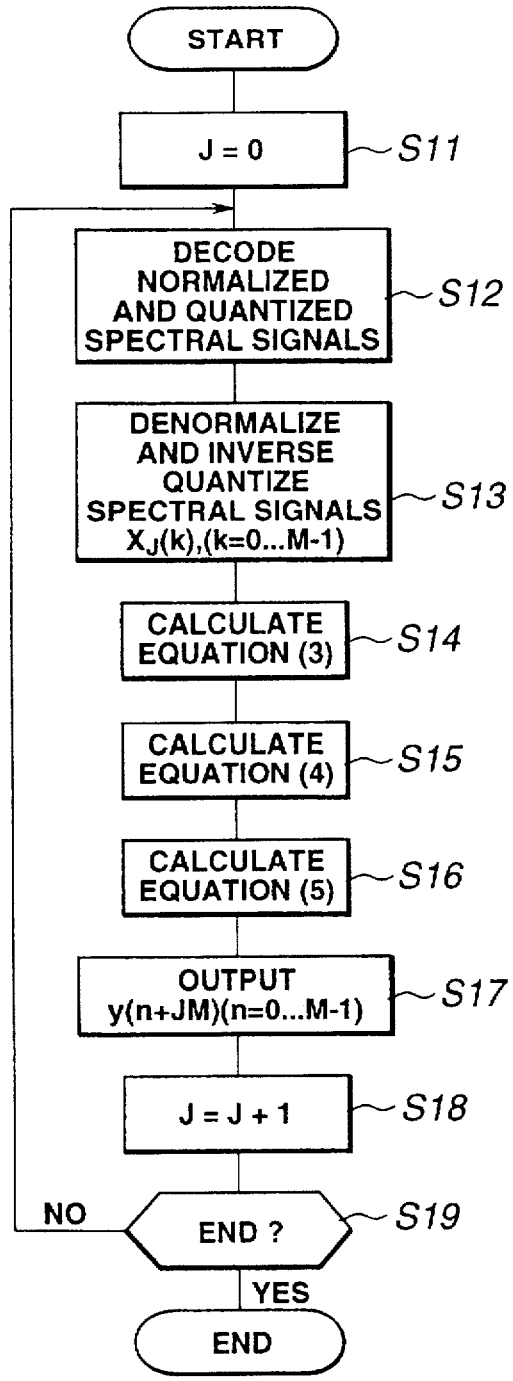

FIG. 17 is a flow chart for illustrating a processing flow of the information decoding method of the present invention.

Figure 18:
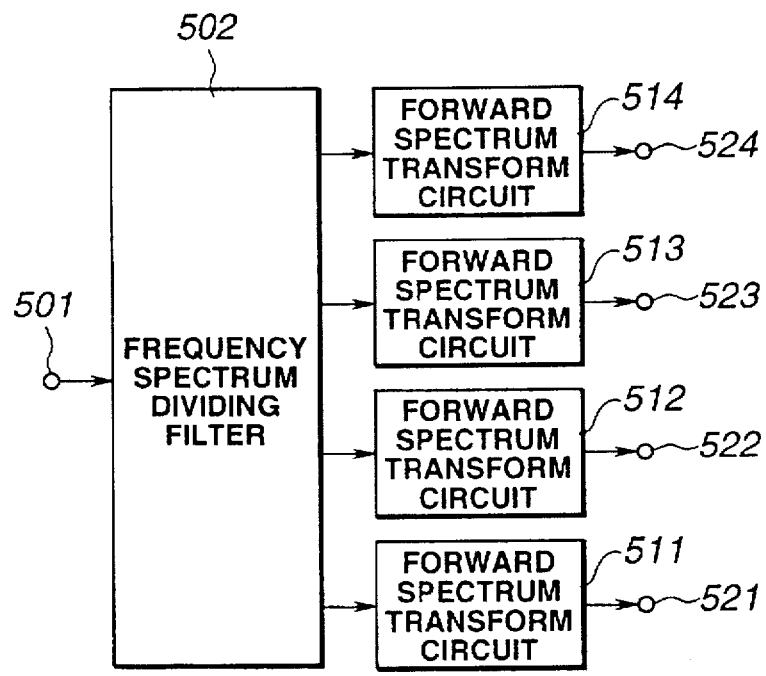

FIG. 18 is a block circuit diagram showing an illustrative embodiment in which a frequency band splitting filter as frequency band splitting means is combined with forward orthogonal transform means such as MDCT.

Figure 19:
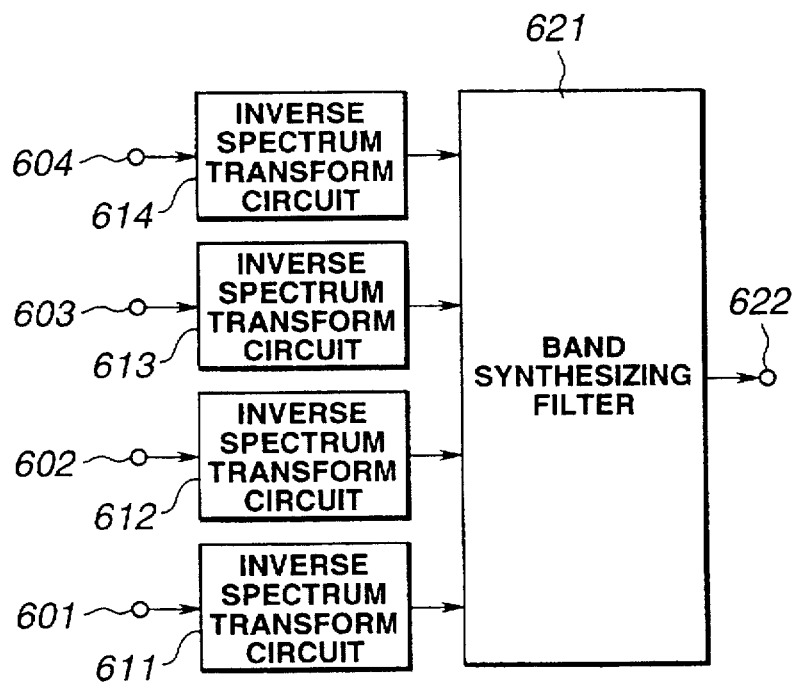

FIG. 19 is a block circuit diagram showing an illustrative embodiment in which forward orthogonal transform means such as IMDCT is combined with a frequency band synthesizing filter as frequency band synthesizing means.

Figure 20:
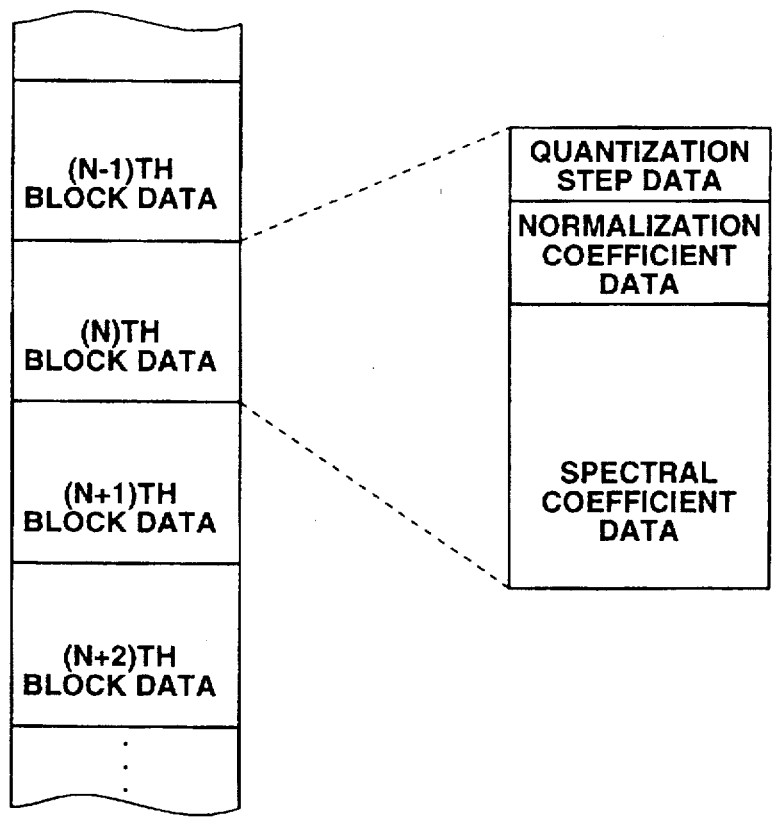

FIG. 20 is a diagrammatic view showing an example of a code obtained on applying the information encoding method of the present invention to waveform signals.

DETAILED DESCRIPTION OF THE INVENTION

Referring to the drawings, preferred illustrative embodiments of the present invention will be explained in detail.

Figure 1:
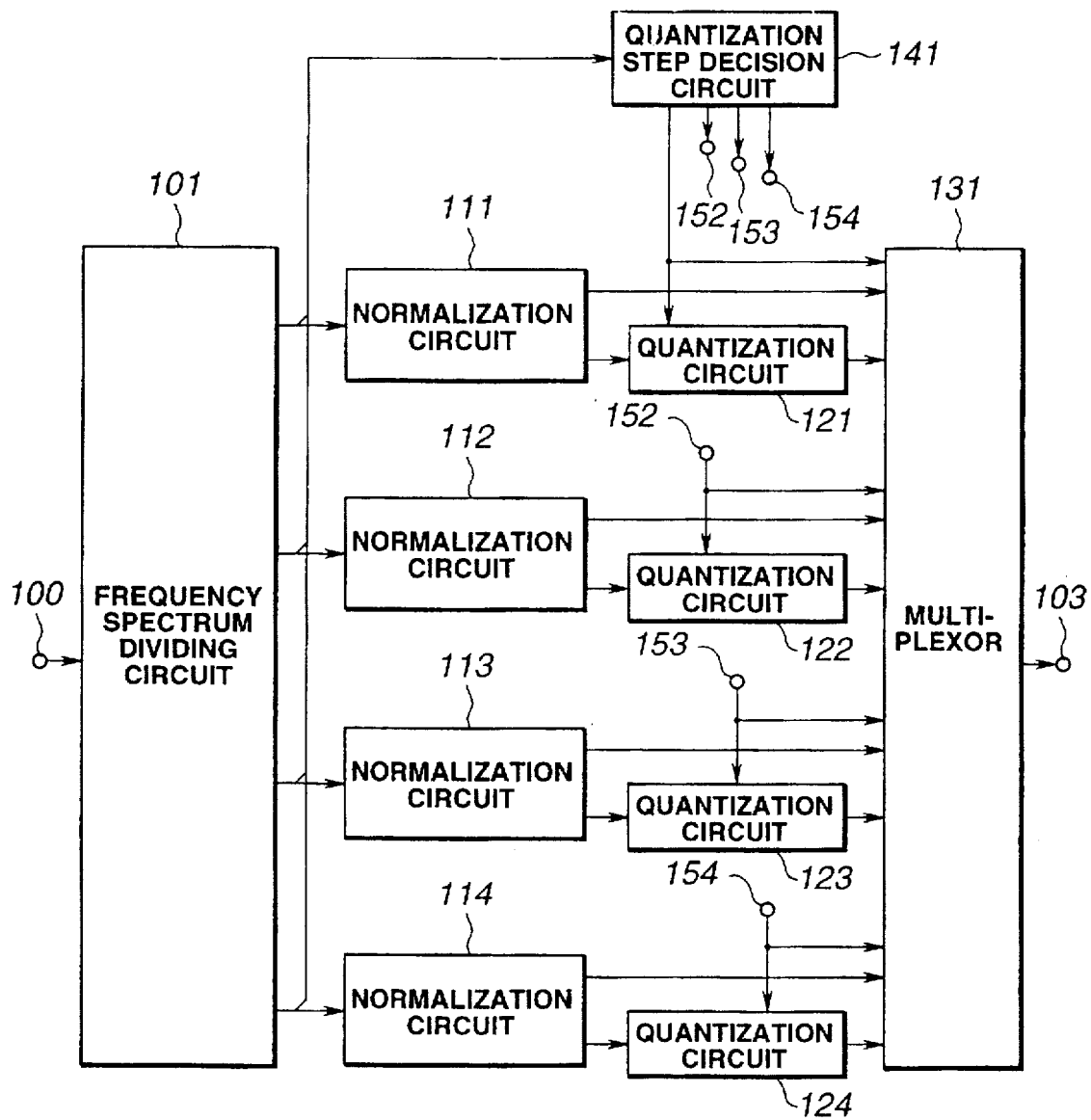
FIG. 1 is a schematic block diagram showing a constitution of an information encoding apparatus according to an embodiment of the present invention.

In FIG. 1, an audio signal entering an input terminal 100 of an information encoding apparatus is divided in frequency by a frequency spectrum dividing circuit 101 having also the function of forward orthogonal transform means. The frequency spectrum dividing means in the frequency spectrum dividing circuit 101 may be means of grouping spectral components resulting from orthogonal transform into plural frequency bands, or means of orthogonal transforming the audio signal divided by a filter into several bands and grouping the resulting spectral components for each of the frequency bands. The frequency bands may be of an equal width or of non-equal widths in conformity to the critical band widths based on the psychoacoustic characteristics of the human auditory system. Although the frequency spectrum is divided into four bands in the embodiment of FIG. 1, it may also be divided into a smaller or a larger number of bands.

The spectral components, divided into respective bands by the frequency spectrum dividing circuit 101, are normalized by associated normalization circuits 111, 112, 113 and 114 for each time block. The normalization circuits 111 to 114 output normalization coefficients and normalized spectral components. The respective normalized signals are quantized by quantization circuits 121, 122, 123 and 124 based upon the quantization step information outputted by a quantization step decision circuit 141 so as to be converted into normalized and quantized signals. In the quantization step decision circuit 141, the quantization steps, that is the bit allocation, are determined by taking advantage of aural masking effects taking into account the psychoacoustic characteristics of the human auditory system. As for the quantization step information supplied to the quantization circuits 121 to 124 from the quantization step decision circuit 141 in FIG. 1, the quantization information supplied to the quantization circuit 122 is transmitted via a terminal 152, while the quantization information supplied to the quantization circuit 123 is transmitted via a terminal 153 and that supplied to the quantization circuit 124 is transmitted via a terminal 104.

The normalized and quantized signals from the quantization circuits 121 to 124, normalized coefficients from the normalization circuits 111 to 114, and the quantization step information from the quantization step decision circuit 141, are multiplexed by a multiplexor 131 into a serial code string which is outputted at a terminal 103. The code string is subsequently recorded on a disc-shaped or a tape-shaped recording medium or a semiconductor recording medium, or transmitted via a transmission system.

Although the quantization step is calculated by the quantization step decision circuit 141 in the embodiment of FIG. 1 based upon the spectral components divided in frequency by the frequency spectrum dividing circuit 101, it may also be calculated from the signals entering the terminal 100, that is the signal prior to frequency spectrum division. Alternatively, it may be calculated based upon the normalization coefficients from the normalization circuits 111 to 114. Although calculations in the quantization step decision circuit 141 may be performed based upon psychoacoustic characteristics of the human hearing system, since the quantization step information is outputted via the multiplexor 131 as described above so as to be subsequently supplied to a signal decoding device, the model simulating the human auditory system may be set in desired manner.

Figure 2:
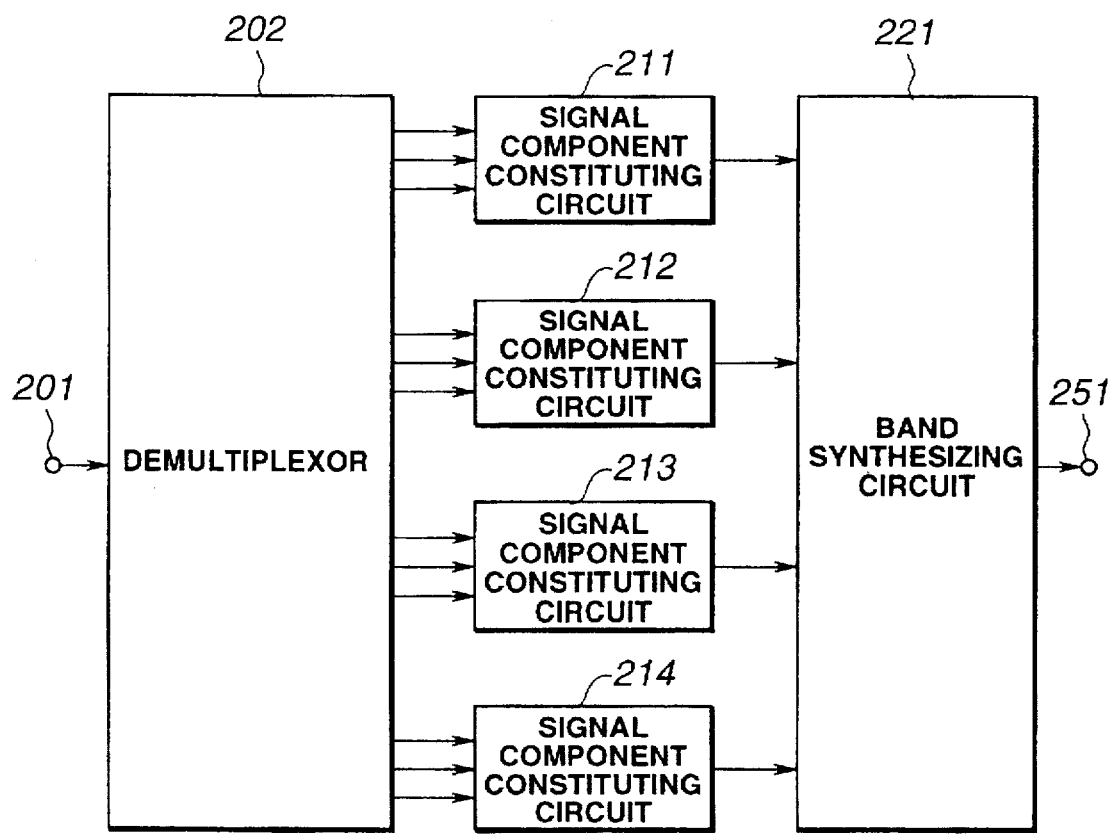
FIG. 2 is a schematic block diagram showing a constitution of an information decoding apparatus according to an embodiment of the present invention.

FIG. 2 shows, in a block circuit diagram, the constitution of an information decoding device for carrying out the information decoding method of the present invention, which is a counterpart device of the information encoding device shown in FIG. 1.

Referring to FIG. 2, the code information (the above-mentioned code string) entering a terminal 201 of the information decoding device of the present embodiment, is routed to a demultiplexor 202 where it is separated and restored into the quantization step information, normalization coefficients and the normalized and quantized information for each frequency band. The band-based quantization step information, normalization coefficients and the normalized and quantized information are respectively transmitted to signal component constituting circuits 211, 212, 213 and 214 for the respective bands also having the function of decoding means. The spectral components from the signal component constituting circuits 212 to 214 are inverse orthogonal transformed and synthesized by a band synthesizing circuit 221 also having the function of an inverse orthogonal transform means, and outputted at a terminal 251 as an audio signal.

Figure 3:
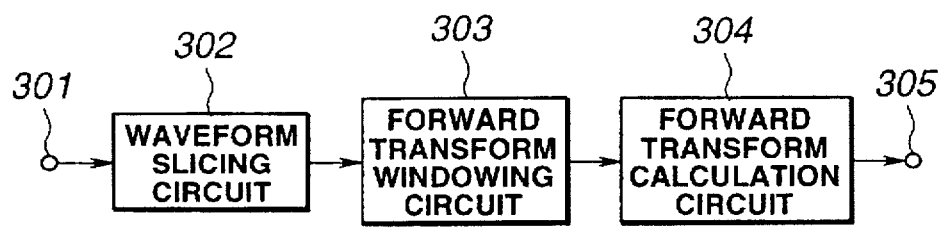
FIG. 3 is a block circuit diagram showing an illustrative constitution of forward orthogonal transform means.
Figure 4:
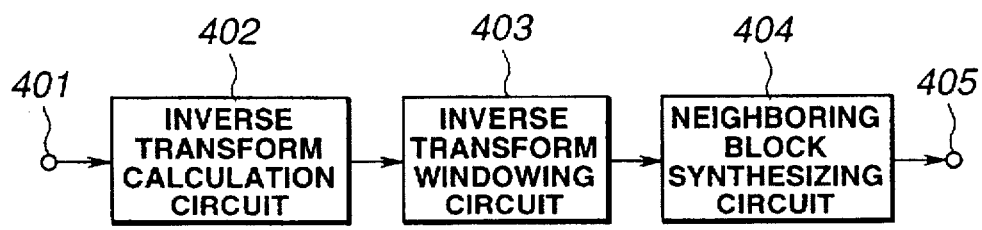
FIG. 4 is a schematic block circuit diagram showing a constitution of inverse orthogonal transform means.

FIG. 3 shows an illustrative constitution of forward orthogonal transform means when employing MDCT in the frequency spectrum division circuit 101 shown in FIG. 1, while FIG. 4 shows an illustrative constitution of inverse orthogonal transform means when employing the inverse MDCT (IMDCT) in the band synthesizing circuit 221 of FIG. 2.

Referring to FIG. 3, the signal from the terminal 100 of FIG. 1 is supplied to an input terminal 301. The input signal is then transmitted to a waveform slicing circuit 302, a forward transform windowing circuit 303 and to a forward orthogonal transform calculating circuit 304 in this order. The waveform slicing circuit 302 slices the waveform signal supplied thereto via a terminal 301, while the forward conversion windowing circuit 303 carries out the calculations of the equation (1):

$$X_{1,J} = W_1(N) \times (n+JM), \quad 0 \leq n < 2M \tag{1}$$

The forward orthogonal transform calculating circuit 304 carries out the calculations of the equation (2):

$$X_J(k) = \frac{2}{M} \sum_{n=0}^{2M-1} x_{1,J}(n) \cos\left(\frac{\pi(2k+1)(2n+M+1)}{4M}\right), \tag{2}$$

$$0 \leq k < M$$

In the above equations (1) and (2), J, M, x(n), $X_J(k)$ and $w_1(n)$ represent the block numbers, the number of output spectra, an input waveform signal, an output spectral signal as found for each block and the forward orthogonal transform windowing function, respectively.

Referring to FIG. 4, output signals of the signal component constituting circuits 211 to 214 of FIG. 2 are fed to a terminal 401 as an input signal. The input signal is fed to an inverse orthogonal transform circuit 402, an inverse conversion windowing circuit 403 and to a neighboring block synthesizing circuit 404 in this order. The inverse orthogonal transform circuit 402 carries out the calculations of the equation (3):

$$x_{2,J}(n) = \sum_{k=0}^{M-1} X_J(k) \cos\left(\frac{\pi(2k+1)(2n+M+1)}{4M}\right), \quad 0 \leq n < 2M \tag{3}$$

while the inverse conversion windowing circuit 403 carries out the calculations of the equation (4):

$$X_{3,J}(n) = W_2(n) x_{2,J}(n), \quad 0 \leq n < 2M \tag{4}$$

and the neighboring block synthesizing circuit 404 carries out the calculations of the equation (5):

$$y(n+JM) = X_{3,J-1}(n+M) + x_{3,J}(n), \quad 0 \leq n < M \tag{5}$$

In the above equations (3), (4) and (5), J, M, $X_J(k)$, y(n) and $w_2(n)$ represent the block numbers, the number of output spectra, an input spectral signal supplied to each block, an output waveform signal and the inverse orthogonal transform windowing function, respectively.

It is noted that coincidence of x(n) and y(n) as found from the equations (1) to (5) means that the original waveform can be correctly restored if there is no information loss due to encoding. This requirement is indispensable if the encoding and decoding means for the waveform signal is to have sufficient performance. In order for y(n) to be coincident with x(n) so as to be found easily from the equations (1) to (5), $w_1(n)$ and $w_2(n)$ must satisfy the following conditions:

$$w_1(n) w_2(n) + w_1(n+M) w_2(n+M) = 1, \quad 0 \leq n < M \tag{6}$$

$$w_1(2M-n-1) w_2(n+M) = w_1(M-n-1) w_2(n), \quad 0 \leq n < M \tag{7}$$

On the other hand, if the windowing function for forward orthogonal transform is coincident with the windowing function for inverse orthogonal transform, that is if the condition of the equation (8)

$$w_1(n)=w_2(n)=w(_n),\ 0\leq n<M \qquad (8)$$

is satisfied, the common windowing information may be employed by the information encoding device and the information decoding device, so that the number of the coefficient data may be decreased when encoding or decoding is carried out using a sole changeover unit. This is convenient in reducing the hardware scale. Also, if these common coefficient data are symmetrical as shown in the equation (9)

$$w(2M-1-N)=w(_n),\ 0\leq n<M \qquad (9)$$

the number of the coefficient data may conveniently be halved. If the windowing functions satisfying the conditions of the equations (8) and (9) are analyzed, the conditions of the equations(6) and (7) are tantamount to satisfying the equation (10):

$$w^2(n)+w^2(n+M)=1,\ 0\leq<M \qquad (10)$$

Meanwhile, in the conventional encoding and decoding devices employing the transform by MDCT and IMDCT, the function of the equation (11)

$$w(n)=\sin\left(\frac{\pi(n+0.5)}{2M}\right),\ 0\leq n<2M \qquad (11)$$

was employed as a windowing function satisfying the equation (10).

FIGS. 5A to 5C show the results of the orthogonal transform in case of employing the windowing function of the equation (11), where M=64. That is, FIGS. 5A, 5b and 5C show the shape, that is, characteristics of the windowing function, an input waveform signal obtained on sampling a sine wave and spectral components obtained on carrying out MDCT on the input waveform signal using the windowing function, respectively. It is noted that the curve of FIG. 5A may also be polygonal lines for discrete values such as sampling values. In general, if the shape of a windowing function for forward orthogonal transform is not sufficiently smooth, the signal energy distribution of the spectral components is poor in concentration and tends to be spread broadly. Consequently, with the windowing function rapidly approaching to zero towards both skirt portions, as shown in FIG. 5A, the energy distribution of the spectral components when employing such function is not sufficiently small towards the skirt portions with respect to the peak energy. For accurately encoding the signal presenting the spectral distribution spread over a wide frequency range, it is necessary to quantize the large number of spectral components with sufficient accuracy. This, however, is not desirable in improving the encoding efficiency.

In this consideration, the windowing function for forward orthogonal transform is adapted to be changed smoothly at both skirt portions so that the above-mentioned constraint is satisfied. For providing a windowing function changed at both ends sufficiently smoothly, the function shown for example in the equation (12):

$$w(n)=\begin{cases}\sin\left(\frac{\pi}{4}\left(\frac{2(n+0.5)}{M}\right)^p\right),\ 0\leq n<\frac{M}{2}\\ \sqrt{1-w^2(M-1-n)}\ ,\frac{M}{2}\leq n<M\\ w(2M-1-n),\ M\leq n<2M\end{cases} \qquad (12)$$

may be employed.

If p in the equation (12) is set to 1 (p=1), the equation (12) is the equation (11). If p is of a value larger than 1, the resulting curve is smoothly changed to zero at both skirt ends, that is, the inclination of the curve is gradually reduced as both skirt ends of the curve are approached.

FIGS. 6a and 6A to 6C show the windowing function in which p in the equation (12) is set to 2 (p=2). It is seen from comparison with the function of FIGS. 5a and 5A to 5C that, since the windowing function is smoothly changed at both skirt ends towards zero, the spectral components resulting from the use of such windowing function rapidly approach to zero in a direction away from the energy peak value. Thus it becomes possible to encode the original waveform signal with high accuracy simply by quantizing a smaller number of spectral components with high accuracy and hence to raise the encoding efficiency. Meanwhile, if the differences for extremely small units of the curve of the windowing function are plotted, a curve shown in FIG. 6a and a curve shown in FIG. 5a are obtained for the windowing functions shown in FIGS. 6A to 6C and FIGS. 5A to 5C, respectively. It is seen from these figures that the windowing function shown in FIGS. 6a and 6A to 6C is smoother at both ends than that shown in FIGS. 5a and 5A to 5C.

Although the windowing function may be improved in smoothness at both ends by increasing the value of p as explained above, the rising and decay portions of the windowing function become steeper at raising and decaying portions. Thus the encoding efficiency cannot be increased by excessively increasing the value of p. FIG. 7A shows an example for the value p equal to 4, in a similar manner to FIG. 5. It is seen from FIG. 7C that the energy distribution of the spectral components becomes lower in concentration than for the value equal to 2. Thus the encoding efficiency may be effectively improved by selecting the value of p to be in the vicinity of 2.

In the foregoing description, the windowing function in its entirety is assumed to be given by the equation (12). However, such restrictions may be relaxed, as will now be explained.

Referring to FIG. 8, if the quantization noise is superimposed on spectral components resulting from forward orthogonal transform of waveform signals employing the windowing function shown in FIG. 5, and the spectral components are again converted into time-domain waveform signals, the quantization noise is spread over the entire transform block. If the waveform signal SW is suddenly increased at an intermediate portion of the transform block, as shown in FIG. 8B, the quantization noise QN becomes large as compared to the waveform signal SW for the domain of the small amplitude of the original waveform signal. Thus the quantization noise is not effectively masked by the concurrent masking effect and is obstructive to the auditory sense.

FIG. 9 illustrates an example of the prior-art technique devised for diminishing the obstructions to the auditory sense. In general, for a quasi-stationary waveform signal portion, a longer transform block length leads to increased encoding efficiency because the signal energy is concentrated in a particular spectral component. However, for a portion with a rapidly changing sound, a longer transform block length raises the problem of pre-echo. If the transform block length is diminished for the portion with the rapidly changing sound portion for sufficiently shortening the time period of occurrence of the pre-echo, the so-called backward masking effect by the original signal acts for eliminating the obstructions to the auditory sense. This is exploited in the method of FIG. 9 for selectively changing over the transform block length responsive to the properties of respective portions of the waveform signal.

As a modification of the method of FIG. 9, there is also proposed a method of interposing a block having an asymmetrical windowing function between a short transform portion with a short transform block length and a long transform portion with a long transform block length, as shown in FIG. 10. This gives a windowing function extending over the entire transform range without reducing both ends of the long transform portion to zero, so that the signal energy distribution on orthogonal transform is improved in concentration thus improving the encoding efficiency. The asymmetrical windowing function is disclosed in JP Kohyo-Patent 4-503136.

The windowing function for forward orthogonal transform for MDCT, for example, may be represented in general as having a shape as shown in FIG. 11. The windowing function may be construed as being devoid of a high level portion and low level portions L1, L2. In the present invention, it is the transient portions E1 and E2 in FIG. 11 that determine the shape of the windowing function. If the shape of these portions is given by shifting the equation (12), the above shape of the windowing function is comprised within the scope of the present invention. FIGS. 12A to 12C and 13A to 13C illustrates the effect derived when the shape of the windowing function of the present invention is applied to the windowing function for long transform block length portion designed to be smoothly connected to the windowing function for short transform block length portion. FIGS. 12A to 12C show a comparative example in which the shape of the conventional windowing function is applied to the transient portion for comparison with the present invention, and FIGS. 13A to 13C show an example in which the shape of the windowing function according to the present invention is applied to the transient portion. It is seen that the energy distribution of the spectral components is evidently higher in concentration in the example of FIGS. 13A to 13C than in the example of FIGS. 12A to 12C.

FIGS. 14A to 14C and 15A to 15C show the effect of applying the method of the present invention to the asymmetrical windowing function shown in FIG. 10. FIGS. 14A to 14C show a comparative example in which the shape of the conventional windowing function is applied to the transient portion for comparison with the present invention, and FIGS. 15A to 15C show an example in which the shape of the windowing function according to the present invention is applied to the transient portion. It is seen that the energy distribution of the spectral components is evidently higher in concentration in the example of FIGS. 15A to 15C than in the example of FIGS. 14A to 14C.

The above-described windowing function of -the present invention can be given only approximately, rather than strictly, by the above equation (12). If an error between the function thus given and the windowing function corresponding to the equation (12) with p=2, such as an error given by a mean square error, is smaller than the error with respect to the function (11), the approximate function may naturally be comprised within the present invention.

The above holds true as to the shape of the windowing function and the distribution of the spectral components when the windowing function is multiplied at the time of orthogonal transform by the information encoding device and divided by the same constant at the time of inverse orthogonal transform by the information decoding device. The above-described comparison is naturally carried out after correcting changes caused in the windowing function by the multiplication and division by the constant number.

The windowing function determined for p=2 in the equation (12) according to the present invention is to be construed as comprising any of the above defined modifications.

FIGS. 16 and 17 illustrate the processing flow of the encoding and decoding operations exploiting the method of the present invention.

Referring to FIG. 16, the block number J is set at step S1 to 0 (J=)). At the next step S2, the calculations of the equation (2) are carried out. At the next step 3, the calculations of the equation (3) are carried out. At step S4, the resulting spectral components are normalized and quantized. At step S5, the normalized and quantized spectral components are encoded. At step S6, the block number J is incremented. At step S7, it is judged whether or not the program is to be terminated. If the result is NO, the program reverts to step S2 and, if the result is YES, the program comes or a close.

Referring to FIG. 17, the block number J is set at step S11 to 0 (J=0). At the next step S12, the normalized and quantized spectral components are decoded. At step S13, the resulting spectral components are denormalized and inverse quantized. At steps S14, S15 and S16, the calculations of the equations (3), (4) and (5) are respectively carried out. At the next step S17, the resulting waveform signals are outputted. At the next step S18, the block number J is incremented and, at the next step S19, it is judged whether or not the program is to be terminated. If the result is NO, the program reverts to step S2 and, if the result is YES, the program comes or a close.

The above description has been made with reference to the frequency spectrum dividing circuit 101 and the frequency band synthesizing circuit 221 designed to directly carry out MDCT and IMDCT, respectively. These circuits may however be adapted to perform other frequency spectrum dividing and synthesizing methods. For example, FIGS. 18 and 19 respectively illustrate an example of combination of a frequency spectrum dividing filter 502 as the frequency spectrum dividing means and forward orthogonal transform circuits 511 to 514, such as MDCT circuits, and an example of combining forward orthogonal transform circuits 611 to 614, such as IMDCT circuits, as frequency band synthesizing means, and a frequency band synthesizing filter 621.

Referring to FIG. 18, the signal from the terminal 100 of FIG. 1 is supplied to an input terminal 501. This input signal is divided by a frequency spectrum dividing filter 502 into plural frequency bands. The signals of the respective bands are supplied to forward orthogonal transform circuits 511 to 514. The forward orthogonal transform circuits 511 to 514 perform forward orthogonal transform employing the windowing function for forward orthogonal transform as explained above. The resulting orthogonal transformed signals are routed via associated terminals 521 to 524 to the normalization circuits 111 to 114 of FIG. 1.

Referring to FIG. 19, signals from -the signal component constituting circuits 211 to 214 of FIG. 2 are supplied to terminals 601 to 604, respectively, and thence supplied to associated inverse orthogonal transform circuits 611 to 614, respectively. The inverse orthogonal transform circuits 611 to 614 perform inverse orthogonal transform employing the windowing function for inverse orthogonal transform as explained above. The resulting inverse orthogonal transformed signals are routed to a frequency band synthesizing filter 621 to produce a synthesized signal which is outputted at a terminal 622.

The forward orthogonal transform circuits 511 to 514 and the inverse orthogonal transform circuits 611 to 614 may be arranged as shown in FIGS. 3 and 4, respectively. For these cases, the above-described method of the present invention may also be applied.

The forward orthogonal transform employing the windowing function of the equation (12) with p=2 and the inverse orthogonal transform employing the windowing function of the equation (12) with p=2 are meant to comprise these cases.

FIG. 20 shows an example of a code string produced on applying the method of the present invention to a waveform signal. This code string may be recorded on a recording medium or transmitted over a transmission channel. In the present example, the waveform signal is transformed by MDCT on the block basis and the resulting spectral components are normalized and quantized. That is, in the example shown in FIG. 20, the information of the respective blocks is made up of the quantization step information, normalization coefficient information and the spectral coefficient information.

The above description has been made in connection with the case of employing MDCT as orthogonal transform of overlapping the waveform elements between neighboring time blocks during inverse transform. With MNDCT, the orthogonal transform that may be calculated using the same equation for the total blocks may be easily and conveniently realized. However, the present invention may also be applied to the case of employing an alternative transform method as the orthogonal transform of overlapping the waveform elements between neighboring time blocks during inverse transform. Such alternative example of the orthogonal transform is disclosed in for example, J. Princen and A.B. Bradley, Analysis/Synthesis Filter Bank Design Based on Time Domain Aliasing Cancellation, IEEE Trans. on Account., Speech Synthesis and Signal Processing, Vol. ASSP-34 No.5, Oct. 1986.

Although the above description has been made in connection with the case of application of the present invention to acoustic waveform signals, the present invention may also be applied to other sorts of signals, such as picture signals. However, the method of the present invention is most effective for a signal having acute spectral distribution. Thus the method of the present invention may be effectively employed for acoustic signals for which encoding with particularly high accuracy is required in view of characteristics of the human auditory system. The method of the present invention may naturally be applied not only to recording of the encoded information on a recording medium but also to transmitting the encoded information.

What is claimed is:

1. A method for encoding signals, comprising the steps of:

forward orthogonally transforming an input signal using a pre-set windowing function to form an output spectral signal; and encoding the output spectral signal, wherein the pre-set windowing function is represented by the equation $$w(n) = \begin{cases} \sin\left(\frac{\pi}{4}\left(\frac{2(n+0.5)}{M}\right)^p\right), & 0 \leq n < \frac{M}{2} \\ \sqrt{1 - w^2(M-1-n)}, & \frac{M}{2} \leq n < M \\ w(2M-1-n), & M \leq n < 2M \end{cases}$$

where w(n) is the windowing function, p is a value in the vicinity of 2, and M is the number of output spectral components.

2. The method as claimed in claim 1, wherein the forward orthogonal transform is the forward orthogonal transform of overlapping waveform elements of a time block with those of a neighboring block.

3. The method as claimed in claim 2, wherein the forward orthogonal transform is a modified discrete cosine transform.

4. The method as claimed in claim 1, wherein the pre-set windowing function does not include a domain having a zero value.

5. The method as claimed in claim 1, wherein the pre-set windowing function includes a domain having a zero value.

6. The method as claimed in claim 1, wherein the pre-set windowing function has a symmetrical shape.

7. The method as claimed in claim 1, wherein the pre-set windowing function has an asymmetrical shape.

8. The method as claimed in claim 1 wherein the input signal is an acoustic signal.

9. An apparatus for encoding signals, comprising:

means for forward orthogonally transforming an input signal using a pre-set windowing function to form an output spectral signal; and means for encoding the output spectral signal, wherein the pre-set windowing function is represented by the equation $$w(n) = \sin\left(\frac{\pi}{4}\left(\frac{2(n+0.5)}{M}\right)^p\right), 0 \leq n < \frac{M}{2}$$

$$\sqrt{1 - W^2(m-1-N)}, \frac{M}{2} \leq n < M$$

$$W(2M-1-n), M \leq 2 < 2M$$

where w(n) is the windowing function, p is a value in the vicinity of 2, and M is the number of output spectral components.

10. The apparatus as claimed in claim 9, wherein the forward orthogonal transform is the forward orthogonal transform of overlapping waveform elements of a time block with those of a neighboring block.

11. The apparatus as claimed in claim 9, wherein the forward orthogonal transform is a modified discrete cosine transform.

12. The apparatus as claimed in claim 9, wherein the pre-set windowing function does not include a domain having a zero value.

13. The apparatus as claimed in claim 9, wherein the pre-set windowing function includes a domain having a zero value.

14. The apparatus as claimed in claim 9, wherein the pre-set windowing function has a symmetrical shape.

15. The apparatus as claimed in claim 9, wherein the pre-set windowing function has an asymmetrical shape.

16. The apparatus as claimed in claim 9, wherein the input signal is an acoustic signal.

17. A method for decoding signals, comprising the steps of:

decoding an encoded signal encoded by a pre-set function for outputting a spectral signal; and inverse orthogonally transforming the spectral signal using a pre-set windowing function, wherein the pre-set windowing function is represented by the equation $$w(n) = \sin\left(\frac{\pi}{4}\left(\frac{2(n+0.5)}{M}\right)^p\right), 0 \leq n < \frac{M}{2}$$

$$\sqrt{1 - W^2(m-1-N)}, \frac{M}{2} \leq n < M$$

$$W(2M-1-n), M \leq 2 < 2M$$

where w(n) is the windowing function, p is a value in the vicinity of 2, and M is the number of output spectral components.

18. The method as claimed in claim 17, wherein the inverse orthogonal transform is the inverse orthogonal transform of overlapping waveform elements of a time block with those of a neighboring block.

19. The method as claimed in claim 17, wherein the orthogonal transform is an inverse modified discrete cosine transform.

20. The method as claimed in claim 17, wherein the pre-set windowing function does not include a domain having a zero value.

21. The method as claimed in claim 17, wherein the pre-set windowing function includes a domain having a zero value.

22. The method as claimed in claim 17, wherein the pre-set windowing function has a symmetrical shape.

23. The method as claimed in claim 17, wherein the pre-set windowing function has an asymmetrical shape.

24. The method as claimed in claim 17, wherein the input signal is an acoustic signal.

25. An apparatus for decoding signals, comprising:
means for decoding an encoded signal encoded by a pre-set function for outputting a spectral signal; and
means for inverse orthogonally transforming the spectral signal using a pre-set windowing function, wherein the pre-set windowing function is represented by the equation $$w(n) = \sin\left(\frac{\pi}{4}\left(\frac{2(n+0.5)}{M}\right)^p\right), 0 \leq n < \frac{M}{2}$$

$$\sqrt{1 - W^2(m-1-N)}, \frac{M}{2} \leq n < M$$

$$W(2M - 1 - n), M \leq 2 < 2M$$

where w(n) is the windowing function, p is a value in the vicinity of 2, and M is the number of output spectral components.

26. The apparatus as claimed in claim 25, wherein the inverse orthogonal transform is the inverse orthogonal transform of overlapping waveform elements of a time block with those of a neighboring block.

27. The apparatus as claimed in claim 25, wherein the inverse orthogonal transform is an inverse modified discrete cosine transform.

28. The apparatus as claimed in claim 25, wherein the pre-set windowing function does not include a domain having a zero value.

29. The apparatus as claimed in claim 25, wherein the pre-set windowing function includes the domain having a zero value.

30. The apparatus as claimed in claim 25, wherein the pre-set windowing function has a symmetrical shape.

31. The apparatus as claimed in claim 25, wherein the pre-set windowing function has an asymmetrical shape.

32. The apparatus as claimed in claim 25, wherein the input signal is an acoustic signal.

33. An information recording medium, wherein signals are produced by forward orthogonally transforming an input signal to form an output spectral signal using a pre-set windowing function represented by the equation $$w(n) = \sin\left(\frac{\pi}{4}\left(\frac{2(n+0.5)}{M}\right)^p\right), 0 \leq n < \frac{M}{2}$$

$$\sqrt{1 - W^2(m-1-N)}, \frac{M}{2} \leq n < M$$

$$W(2M - 1 - n), M \leq 2 < 2M$$

where w(n) is the windowing function, p is a value in the vicinity of 2, and M is the number of output spectral components, and by encoding the output spectral signal.

34. The information recording medium as claimed in claim 33, wherein the inverse orthogonal transform is the inverse orthogonal transform of overlapping waveform elements of a time block with those of a neighboring block.

35. The information recording medium as claimed in claim 33, wherein the inverse orthogonal transform is an inverse modified discrete cosine transform.

36. The information recording medium as claimed in claim 33, wherein the pre-set windowing function does not include a domain having a zero value.

37. The information recording medium as claimed in claim 33, wherein the pre-set windowing function includes a domain having a zero value.

38. The information recording medium as claimed in claim 33, wherein the pre-set windowing function has a symmetrical shape.

39. The information recording medium as claimed in claim 33, wherein the pre-set windowing function has an asymmetrical shape.

40. The information recording medium as claimed in claim 33, wherein the input signal is an acoustic signal.

41. A method for transmitting signals, comprising the steps of:
forward orthogonally transforming an input signal to produce an output spectral signal using a pre-set windowing function having characteristics represented by the equation $$w(n) = \sin\left(\frac{\pi}{4}\left(\frac{2(n+0.5)}{M}\right)^p\right), 0 \leq n < \frac{M}{2}$$

$$\sqrt{1 - W^2(m-1-N)}, \frac{M}{2} \leq n < M$$

$$W(2M - 1 - n), M \leq 2 < 2M$$

where w(n) is the windowing function, p is a value in the vicinity of 2, and M is the number of output spectral components; and transmitting the output spectral signal.

42. The method as claimed in claim 41, wherein the inverse orthogonal transform is the inverse orthogonal transform of overlapping waveform elements of a time block with those of a neighboring block.

43. The method as claimed in claim 41, wherein the orthogonal transform is an inverse modified discrete transform.

44. The method as claimed in claim 41, wherein the pre-set windowing function does not include a domain having a zero value.

45. The method as claimed in claim 41, wherein the pre-set windowing function includes a domain having a zero value.

46. The method as claimed in claim 41, wherein the pre-set windowing function has a symmetrical shape.

47. The method as claimed in claim 41, wherein the pre-set windowing function has an asymmetrical shape.

48. The method as claimed in claim 41, wherein the input signal is an acoustic signal.

* * * * *